United States Patent [19]

Motoe et al.

[11] Patent Number: 4,985,701
[45] Date of Patent: Jan. 15, 1991

[54] TIME-DIVISION BIT NUMBER CONVERSION CIRCUIT

[75] Inventors: Hisafumi Motoe, Tokyo; Masaharu Tokuhara, Kanagawa; Takaya Hoshino, Saitama, all of Japan

[73] Assignee: Sony Corporation, Tokyo, Japan

[21] Appl. No.: 379,107

[22] Filed: Jul. 13, 1989

[30] Foreign Application Priority Data

Jul. 28, 1988 [JP] Japan ................. 63-189475

[51] Int. Cl.⁵ .............................. H03M 7/00
[52] U.S. Cl. ........................ 341/61; 341/95; 358/13
[58] Field of Search ............ 358/13, 22; 341/95, 341/61; 375/121, 25

[56] References Cited

U.S. PATENT DOCUMENTS

| 3,414,677 | 12/1968 | Quinlan | 375/25 |
| 3,636,524 | 1/1972 | Holland | 375/122 |
| 3,678,507 | 7/1972 | Rensin | 375/122 |
| 4,728,929 | 3/1988 | Tanaka | 341/95 |

Primary Examiner—John W. Shepperd
Attorney, Agent, or Firm—Hill, Van Santen, Steadman & Simpson

[57] ABSTRACT

A time-division bit number circuit that comprises a bit number expansion system and/or a bit number reduction system. The bit number expansion system converts an N bits signal to a 2N bits signal, while the bit number reduction system converts the 2N bits signal to the N bits signal where N is an integer. Thus, according to the time-division bit amount circuit, the number of memory can be saved, the area of circuit can be reduced and the pattern area of substrate can be reduced.

8 Claims, 5 Drawing Sheets

TIME-DIVISION BIT NUMBER CONVERSION CIRCUIT

BACKGROUND OF THE INVENTION

1. Field of the Invention

The present invention relates generally to a time-division bit number conversion circuit and, more particularly, is directed to a time-division bit number conversion circuit suitably applied to, for example, an input-/output portion of each of digital signal processing portions of a digital television receiver.

2. Description of the Prior Art

Figure 1:
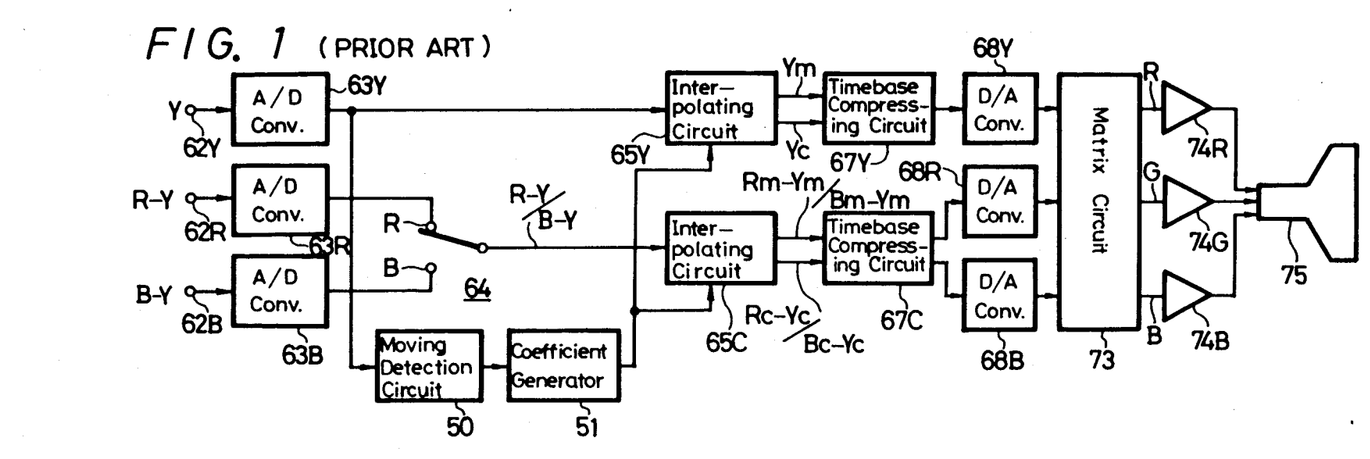
FIG. 1 is a block diagram showing an example of a prior-art television receiver.

FIG. 1 shows an example of a prior-art television receiver.

Referring to FIG. 1, it will be seen that a luminance signal Y applied to an input terminal 62Y is converted to a digital signal by an analog-to-digital (A/D) converter 63Y and is fed to a scanning line interpolating circuit 65Y. A sampling frequency fs in the A/D converter 63Y is selected to be, for example, 14 MHz.

Red and blue color difference signals R-Y and B-Y applied to input terminals 62R and 62B are respectively converted to digital signals by A/D converters 63R and 63B, and are then fed to fixed contacts R and B of a change-over switch 64, respectively. The change-over switch 64 is alternately connected to the fixed contacts R and B at every sampling cycle. A time-division signal R-Y/B-Y of the red and blue color difference signals R-Y and B-Y from the change-over switch 64 is supplied to a scanning line interpolating circuit 65C.

The scanning line interpolating circuits 65Y and 65C generate scanning line signals Yc and Rc-Yc/Bc-Yc in addition to main scanning line signals Ym and Rm-Ym/Bm-Ym simultaneously.

The luminance signal Y from the A/D converter 63Y is supplied to a moving detection circuit 50, and a moving detection signal from the moving detection circuit 50 is supplied to a coefficient generator 51. Value K of multipliers in the scanning line interpolating circuits 65Y and 65C is generated by the coefficient generator 51, and the value K is changed in response to the level of the moving detection signal. For example, K=0 is established for the still picture portion and the maximal value K is 1.

Figure 2:
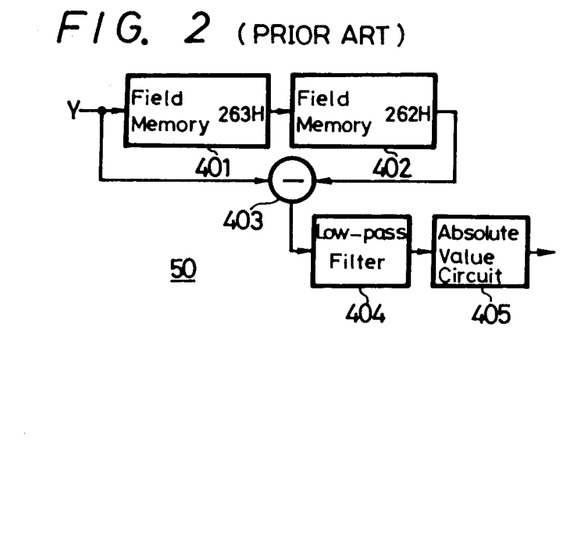
FIG. 2 is a schematic block diagram showing a prior-art moving detection circuit used in the television receiver shown in FIG. 1.

FIG. 2 shows more in detail the arrangement of the moving detection circuit 50 in FIG. 1.

Referring to FIG. 2, it will be seen that the luminance signal Y from the A/D converter 63Y (FIG. 1) is supplied to a series circuit of field memories 401 and 402 forming a delay line. The delay time of the serially-connected field memories 401 and 402 is selected to be one frame (263H+262H).

The input signal to the field memory 401 and the output signal from the field memory 402 are supplied to a subtracter 403 and are thereby subtracted each other. The frame difference signal from the substracter 403 is supplied to a low-pass filter 404, in which a high band noise component and a dot interference component of the frame difference signal are eliminated. The frame difference signal thus processed is supplied to an absolute value circuit 405, in which it is converted to an absolute value signal. The output signal from the absolute value circuit 405 is employed as the moving detection signal.

Figure 3:
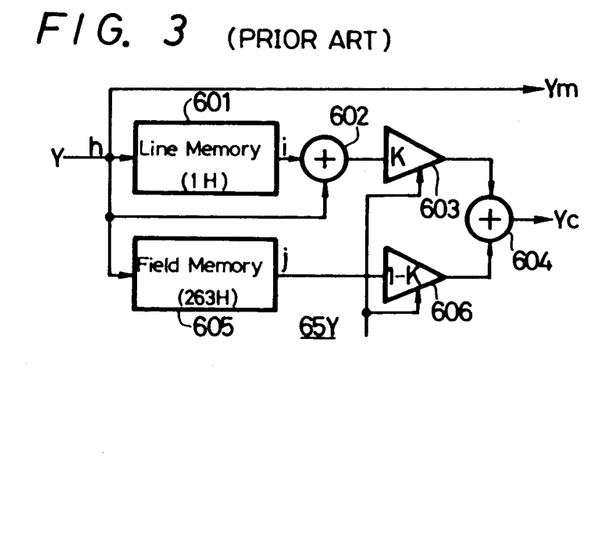
FIG. 3 is a schematic block diagram showing a prior-art scanning line interpolating circuit used in the television receiver shown in FIG. 1.

The scanning line interpolating circuit 65Y is constructed as shown in FIG. 3.

Referring to FIG. 3, it will be seen that the luminance signal Y from the A/D converter 63Y (FIG. 1) is supplied to a line memory 601 (1 H delay time) forming a delay line. The input and output signals of the line memory 601 are supplied to an adder 602, in which they are added and averaged. The thus averaged output signal from the adder 602 is multiplied by K (K≦1) by a multiplier 603, and is then fed to an adder 604.

The luminance signal Y is also supplied to a field memory 605 forming a delay line. The delay time of the field memory 605 is selected to be 263H. The output signal from the field memory 605 is multiplied by (1−K) by a multiplier 606 and is then fed to the adder 604.

Figure 4:
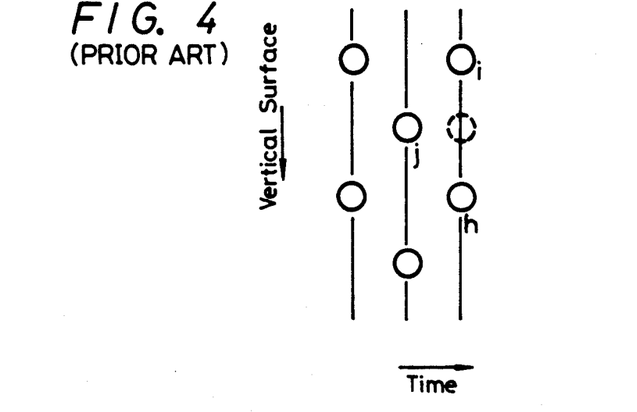
FIG. 4 is a schematic diagram showing a scanning line structure from a time-vertical surface standpoint.

FIG. 4 is a schematic diagram showing a scanning line structure from a time-vertical surface standpoint, in which an open circle represents the scanning line of each field. Assuming that h is the above-mentioned input signal, i the output signal from the line memory 601 and j the output signal from the field memory 605, then these signals h to j are plotted in a positional relationship shown in FIG. 4.

In the scanning line interpolating circuit 65Y, an output signal $$\frac{h+i}{2}$$

of the adder 602 forms an interpolating scanning line signal of a real moving picture portion, and the output signal j of the field memory 605 forms an interpolating scanning line signal of a still picture portion. Thus, the adder 604 generates an interpolating scanning line signal Yc in which the interpolating scanning line signals of the real moving picture portion and the still picture portion are added at a ratio corresponding to the amount of the movement. The scanning line to be interpolated is set at a position shown by a broken line circle shown in FIG. 4. The input signal h is directly used as the main scanning line signal Ym.

The scanning line interpolating circuit 65C is constructed similarly to the scanning line interpolating circuit 65Y and therefore need not be described herein.

Referring back to FIG. 1, the main scanning line signals Ym, Rm-Ym/Bm-Ym and the interpolating scanning line signals Yc, Rc-Yc/Bc-Yc from the scanning line interpolating circuits 65Y and 65C are supplied to timebase-compressing circuits 67Y and 67C, respectively. The timebase-compressing circuits 67Y and 67C timebase-compress the main scanning line signals Ym, Rm-Ym/Bm-Ym and the interpolating scanning line signals Yc, Rc-Yc/Bc-Yc by half, which are then delivered sequentially. In this case, the timebase-compressing circuit 67C generates the red and blue color difference signals, separately.

The double-speed luminance signal and color difference signals from the timebase-compressing circuits 67Y and 67C are converted to analog signals by digital-to-analog (D/A) converters 68Y, 68R and 68B, respectively.

The double-speed luminance signal and color difference signals from the D/A converters 68Y, 68R and 68B are supplied to a matrix circuit 73. The double-speed red, green and blue signals R, G and B from the matrix circuit 73 are respectively supplied through amplifiers 74R, 74G and 74B to a color cathode ray tube (color CRT) 75, whereby a video image is displayed on the color CRT 75 according to the non-interlaced system in which the number of scanning lines is doubled.

Figure 5A:
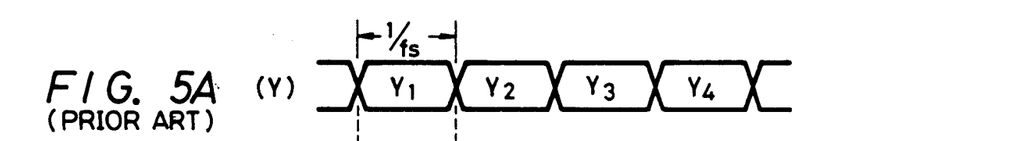
FIGS. 5A to 5C are timing charts used to explain a time-division color signal processing operation in the prior art, respectively.
Figure 5B:
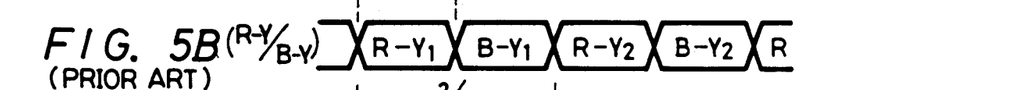
Figure 5C:
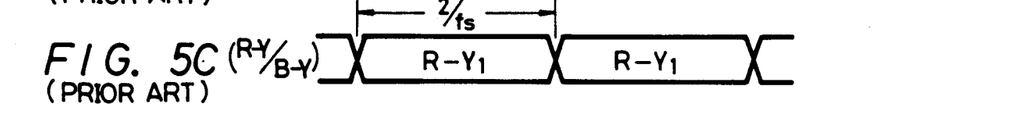

In the prior-art television receiver shown in the example of FIG. 1, the luminance signal Y and the color difference signals R-Y and B-Y are generated from a television tuner (not shown). If the bands of the color difference signals R-Y and B-Y are narrow, then the numbers of samples of, for example, the color difference signals R-Y and B-Y are selected to be ¼ of the number of samples of the luminance signal Y, thus resulting in a so-called 4:1:1 mode. In that event, when the luminance signal Y from the A/D converter 63Y is represented as shown in FIG. 5A, then the time-division signal R-Y/B-Y from the change-over switch 64 becomes as shown in FIG. 5C.

If the bands of the color difference signals R-Y and B-Y are wide, then the numbers of samples of, for example, the color difference signals R-Y and B-Y are made ½ of the number of samples of the luminance signal Y, thus resulting in a so-called 4:2:2 mode. In this case, the time-division signal R-Y/B-Y from the change-over switch 64 becomes as shown in FIG. 5B.

Regardless of the 4:1:1 mode or the 4:2:2 mode, the A/D converters 63R and 63B convert the color difference signals into digital signals in the form of, for example, 8 bits per sample.

The video memory of large capacity used in the scanning line interpolating circuit 65C is generally of 4 bits so that even in the 4:1:1 mode, it is necessary to provide two memories, or a memory of 8 bits. Thus, the memory can not be effectively utilized, which provides an increased circuit scale.

Even in the 4:1:1 mode, the digital signal is transmitted in the unit of 8 bits, thus increasing the pattern area on the substrate.

OBJECTS AND SUMMARY OF THE INVENTION

It is a general object of the present invention to provide an improved time-division bit number conversion circuit which can remove the shortcomings inherent in the prior art.

It is an object of the present invention to provide a time-division bit number conversion circuit which can save the number of memories.

It is another object of the present invention to provide a time-division bit number conversion circuit which can reduce the area of the circuit.

It is another object of the present invention to provide a time-division bit number conversion circuit which can reduce the pattern area on the substrate.

It is still another object of the present invention to provide a time-division bit number conversion circuit which can miniaturize the substrate.

According to an aspect of the present invention, there is provided a bit number expansion system comprising:
 (a) a 2N bits signal input terminal where N is an integer;
 (b) a first memory having 2N bits cells connected to said signal input terminal;
 (c) a second memory having 2N bits cells connected to the outputs of the corresponding cells of said first memory, respectively;
 (d) a third memory having 2N bits cells, the upper and lower input bit terminals thereof being connected to the outputs and the inputs of said first memory, respectively; and
 (e) a first switch connected to the output of said second memory and to the output of said third memory for introducing an expanded-bit output signals from one of N bits of said input terminal when said third memory is selected.

According to other aspect of the present invention, there is provided a bit number reduction system comprising:
 (A) a first memory having a first set of N number of output terminals and a second set of N number of output terminals;
 (B) signal input means connected to said first memory;
 (C) a second memory having N bits cells, said second memory being supplied with output signals from said first set of N number of output terminals of said first memory;
 (D) a first switch for selecting the outputs of said second memory or the outputs of said second set of N number of output terminals of said first memory; and
 (E) a third memory having a first set of N number of inputs connected to said first set of N number of output terminals of said first memory and a second set of N number of inputs connected to the output terminal of said first switch, said third memory having a set of N number of output terminals for bit number reduction.

According to a further aspect of the present invention, there is provided a bit number conversion system comprising:
 (1) a 2N bits signal input terminal;
 (2) a first memory having 2N bits cells connected to said signal input terminal;
 (3) a second memory having 2N bits cells connected to the outputs of the corresponding cells of said first memory, respectively;
 (4) a third memory having 2N bits cells, the upper and lower input bit terminals thereof being connected to the outputs and the inputs of said first memory, respectively;
 (5) a first switch connected to the output of said second memory and to the output of said third memory for introducing an expanded-bit output terminals from one of N bits of said input terminal when said third memory is selected;
 (6) a fourth memory having a first set of N number of output terminals and a second set of N number of output terminals;
 (7) N bits signal input terminal connected to said fourth memory;
 (8) a fifth memory having N bits cells, said fifth memory being supplied with outputs signals from said first set of N number of output terminals of said fourth memory;
 (9) a second switch for selecting the outputs of said fifth memory or the outputs of said second set of N number of output terminals of said fourth memory; and
 (10) a sixth memory having a first set of N number of inputs connected to said first set of N number of output terminals of said fourth memory and a second set of N number of inputs connected to the output terminal of said second switch, said sixth memory having a set of N number of output terminals for bit number reduction.

These and other objects, features and advantages of the present invention will be apparent in the following detailed description of preferred embodiments of the present invention when read in conjunction with the accompanying drawings, in which like reference numerals are used to identify the same or similar parts in the several views.

DETAILED DESCRIPTION OF PREFERRED EMBODIMENTS

The present invention will be explained with reference to the attached drawings.

Figure 6:
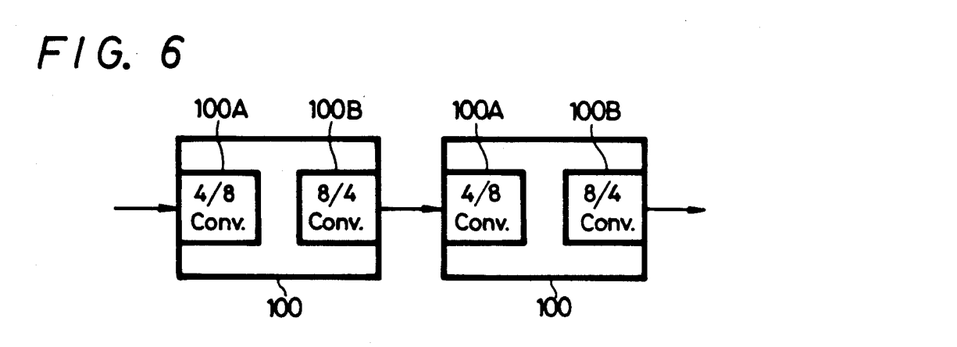
FIG. 6 is a schematic block diagram of a digital processing block having a bit number conversion circuit according to the present invention.

In order to solve the above-mentioned problems, it is proposed that for example, in the case of 4:1:1 mode, 8 bits color difference signals R-Y and B-Y are transmitted after being converted in the form of 4 bits signals. FIG. 6 shows a principle of bit number conversion system of the present invention in which the 4:2:2 mode as well as the 4:1:1 mode are taken into consideration from a design standpoint. The most specific feature of the present invention lies in that a 4 bits/8 bits conversion section 100A and an 8 bits/4 bits conversion section 100B are provided in the input and output portions of the digital processing block 100 as shown in FIG. 6. When the digital signal of 8 bit is transmitted in the 4:2:2 mode, the bit number is not converted. When on the other hand the digital signal of 4 bits is transmitted in the 4:1:1 mode, the bit number is converted, whereby the integrated circuit (IC) of each of the digital processing blocks 100 can be used both in the 4:1:1 mode and in the 4:2:2 mode.

Figure 7:
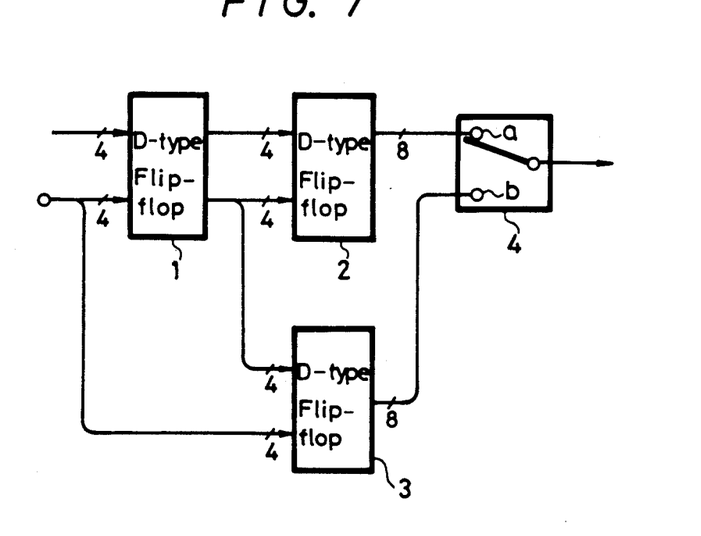
FIG. 7 is a schematic block diagram showing a first embodiment of a bit number conversion (a n bits signal is converted to a 2n bits signal) circuit according to the present invention.

FIG. 7 shows an embodiment of a bit number conversion circuit according to the present invention. In this embodiment of FIG. 7, the bit number conversion circuit is a bit number expansion circuit which converts a 4 bits signal to an 8 bits signal.

As shown in FIG. 7, there are provided 8-bits latch circuits 1 to 3, each of which is formed of a D-type flip-flop. In FIG. 7, reference numeral 4 designates an 8 bits change-over switch or multiplexer.

Referring to FIG. 7, it will be seen that an 8 bits output terminal of the latch circuit 1 is connected to an 8 bits input terminal of the latch circuit 2. An 8 bits output terminal of the latch circuit 2 is connected to a fixed contact a of the change-over switch 4.

The lower 4 bits input terminal of the latch circuit 1 and the lower 4 bits output terminal thereof are connected to the 8 bits input terminal of the latch circuit 3. The 8 bits output terminal of the latch circuit 3 is connected to the fixed contact b of the change-over switch 4.

Figure 8A:
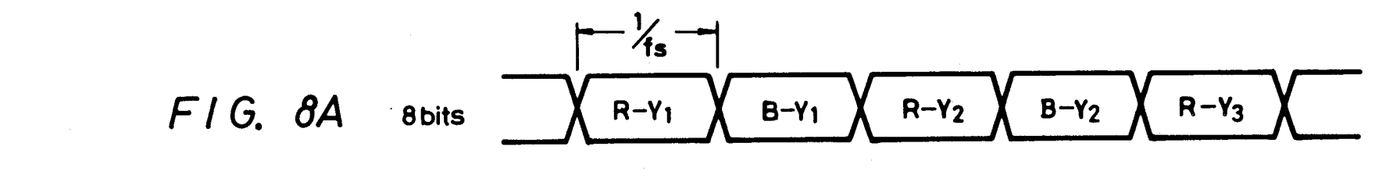
FIGS. 8A to 8E are timing charts used to explain the operation of the first embodiment of the bit number conversion circuit according to the present invention, respectively.
Figure 8B:
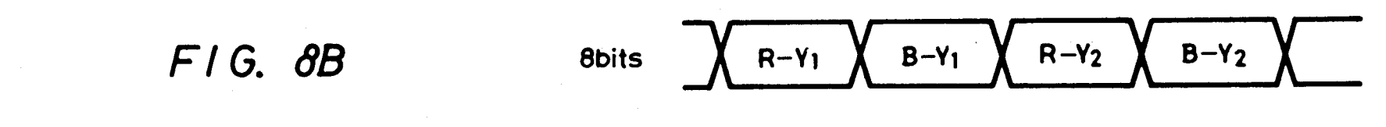
Figure 8C:
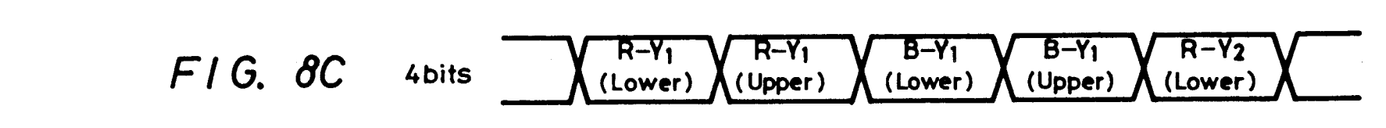

The change-over switch 4 is connected to the fixed contact a when an 8 bits time-division signal of 4:2:2 mode shown in FIG. 8A is supplied to the 8 bits input terminal of the latch circuit 1, and to the fixed contact b when a 4 bits time-division signal of 4:1:1 mode shown in FIG. 8C is supplied to the lower 4 bits input terminal of the latch circuit 1. In FIG. 8, $R\text{-}Y_{1(lower)}$, $B\text{-}Y_{1(lower)}$, . . . represent lower 4 bits signal, while $R\text{-}Y_{1(upper)}$, $B\text{-}Y_{1(upper)}$, . . . represent upper 4 bits signals, respectively.

With the above-mentioned circuit arrangement, when the 8 bits time-division signal of 4:2:2 mode shown in FIG. 8A is supplied to the 8 input terminal of the latch circuit 1, the 8 bits signal shown in FIG. 8B is generated at the 8 bits output terminal of the latch circuit 2, and the 8 bits signal is delivered via the fixed contact a of the change-over switch 4.

Figure 8D:
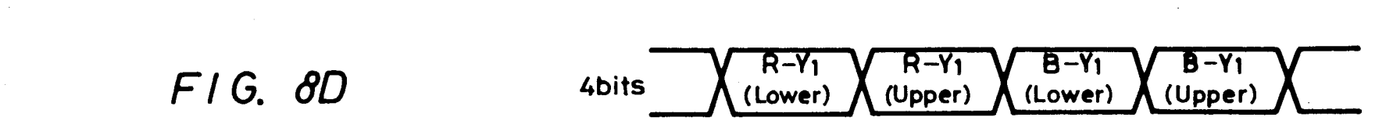
Figure 8E:
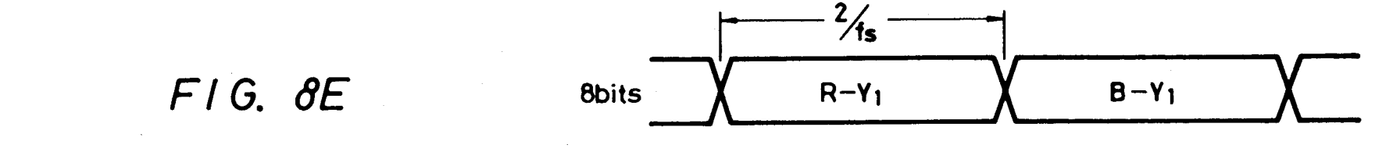

When on the other hand the 4 bits time-division signal of 4:1:1 mode shown in FIG. 8C is supplied to the lower 4 bits input terminal of the latch circuit 1, a 4 bits signal shown in FIG. 8D is generated at the lower 4 bits output terminals of the latch circuit 2. Thus, a correct 8 bits signal in which the upper and lower bits are regularly arranged as shown in FIG. 8E is restored at the 8 bits output terminal of the latch circuit 3. The resultant 8 bits signal is delivered via the fixed contact b of the change-over switch 4.

Figure 9:
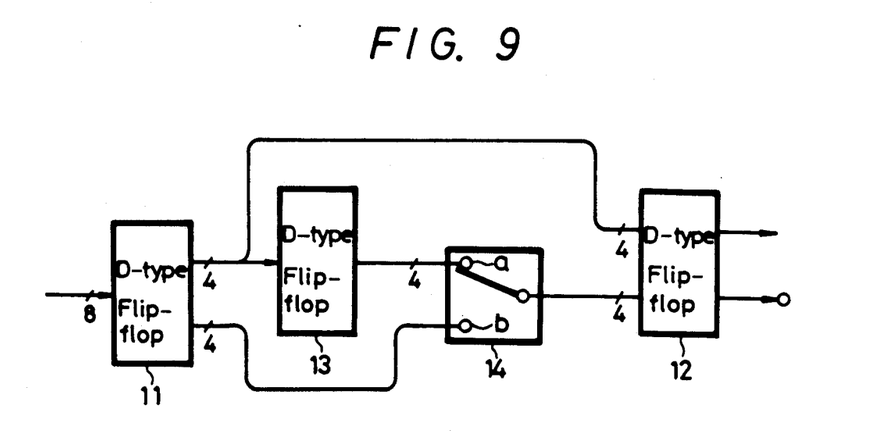
FIG. 9 is a schematic block diagram showing another embodiment of a bit number conversion (a 2n bits signal is converted to a n bits signal) circuit according to the present invention.

FIG. 9 shows another embodiment of a bit number conversion circuit, in particular, a bit number reduction circuit according to the present invention. In this embodiment, 8 bits are converted to 4 bits.

Referring to FIG. 9, there are provided 8 bits latch circuits 11 and 12, each being formed of a D-type flip-flop. There are also provided a 4 bits latch circuit 13 formed of a D-type flip-flop and a 4 bits change-over switch 14.

Referring to FIG. 9, it will be seen that an upper 4 bits output terminal of the latch circuit 11 is connected to an upper 4 bits input terminal of the latch circuit 12 while the lower 4 bits output terminal of the latch circuit 11 is connected to the fixed contact b of the change-over switch 14.

The upper 4 bit output terminal of the latch circuit 11 is connected through the latch circuit 13 to the fixed contact a of the change-over switch 14.

Figure 10A:
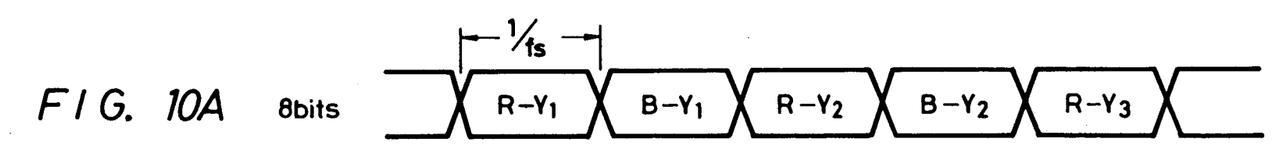
FIGS. 10A to 10G are timing charts used to explain the operation of another embodiment of the bit number conversion circuit according to the present invention.
Figure 10B:
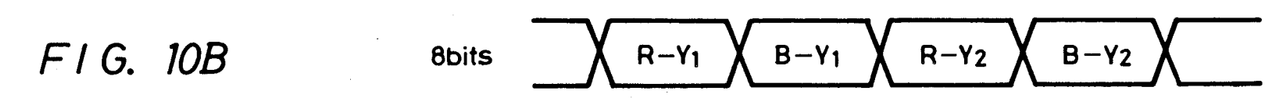
Figure 10C:
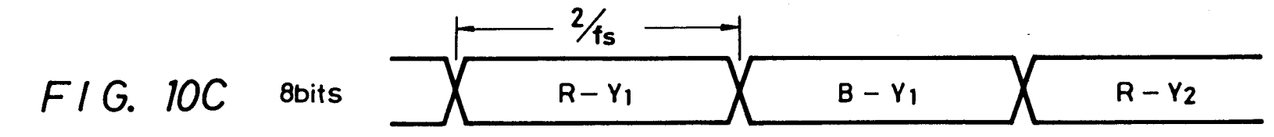
Figure 10D:
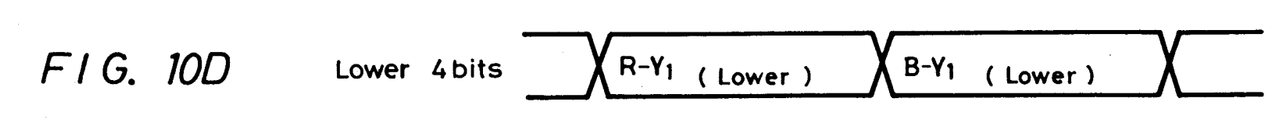
Figure 10E:
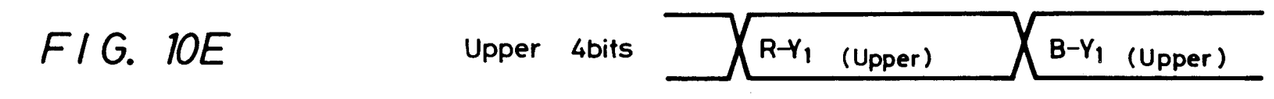
Figure 10F:
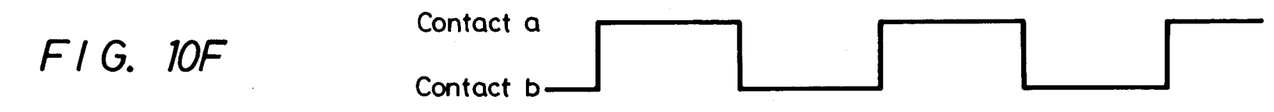

The change-over switch 14 is connected to the fixed contact b when an 8 bits time-division signal of 4:2:2 mode shown in FIG. 10A is supplied to the 8 bits input terminal of the latch circuit 11, while when an 8 bits time-division signal of 4:1:1 mode shown in FIG. 10C is supplied to the 8 bits input terminal of the latch circuit 11, the change-over switch 14 is alternately connected to the fixed contacts a and b at every cycle of 1/fs as shown in FIG. 10F. In FIG. 10, $R\text{-}Y_{1(lower)}$, $B\text{-}Y_{1(lower)}$, ... represent lower 4 bits signals, respectively, while R-Y$_{1(upper)}$, B-Y$_{1(upper)}$, ... represent upper 4 bits signals, respectively.

The output terminal of the change-over switch 14 is connected to the lower 4 bits input terminal of the latch circuit 12.

With the above-mentioned circuit arrangement, when the 8 bits time-division signal of 4:2:2 mode shown in FIG. 10A is supplied to the 8 bits input terminal of the latch circuit 11, an 8 bits signal shown in FIG. 10B is generated at the 8 bits output terminal of the latch circuit 11. The resultant 8 bits signal is delivered to the 8 bits output terminal of the latch circuit 12.

Figure 10G:
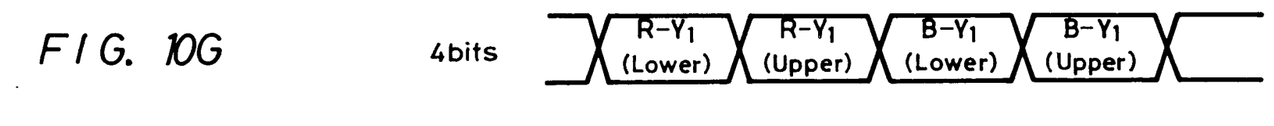

When on the other hand the 8 bits time-division signal of 4:1:1 mode shown in FIG. 10C is supplied to the 8 bits input terminal of the latch circuit 11, a lower 4 bits signal shown in FIG. 10D is generated at the lower 4 bits output terminal of the latch circuit 11. Simultaneously, an upper 4 bits signal shown in FIG. 10E is generated at the 4 bits output terminal of the latch circuit 13. Thus, the change-over switch 14 selectively produces a 4 bits signal shown in FIG. 10G, and the 4 bits signal is delivered to the lower 4 bits output terminal of the latch circuit 12.

As described above, according to the bit number expansion circuit in the embodiment shown in FIG. 7, the 4 bits signal is converted to the 8 bits signal, whereas according to the bit number reduction circuits of another embodiment shown in FIG. 9, the 8 bits input signal is converted to the 4 bits signal. Therefore, the above-mentioned bit number conversion circuits are provided at the input and output portions of the digital processing block, whereby in the 4:1:1 mode, for example, the 4 bits digital signal can be transmitted between the digital processing block and the memory. Thus, it is not necesary to use two of 4 bit memories, which fact provides a reduced memory and a reduced circuit area on the substrate. Further, the transmission line can be reduced and the pattern area of the substrate can be reduced, thus miniaturizing the substrate.

According to the embodiments shown in FIGS. 7 and 9, since the 2n bits input signal can be directly transmitted so that even when the bit number conversion circuit is provided at the input and output portions of the digital processing block, the digital processing block can be utilized to transmit the 8 bits signal of 4:2:2 mode without modification thereof. Thus, it is not necessary to separately design the IC of the digital processing block which is applied to the 4:2:2 mode.

While in the embodiment shown in FIG. 7 the 4 bits input signal is converted to the 8 bits signal as described above, it is possible to similarly construct an apparatus which can convert a n (n is a natural number) bits signal to a 2n bits signal.

Further, while in another embodiment shown in FIG. 9 the 8 bits input signal is converted to the 4 bits signal as described above, it is needless to say that the 2n bits signal can be converted to the n bits signal.

According to the present invention, as set forth above, the input 2n bits signal can be converted to the n bits signal or the input n bits signal can be converted to the 2n bits signal. Therefore, by providing the bit number expansion circuit or the bit number reduction circuit of this invention at the input and output portions of the digital processing block, it becomes possible to transmit the n bits signal between the digital processing block and the memory. Thus, the memory can be saved, the circuit area and the pattern area on the substrate can be reduced.

Furthermore, since the input 2n bits signal can be directly transmitted so that even when the bit number expansion circuit or the bit number reduction circuit according to the present invention is provided at the input and output portions of the digital processing block, the above digital processing block can be used to transmit the 2n bits signal without the modification thereof. Thus, the IC need not be designed independently.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

We claim as our invention:

1. A bit number expansion system comprising:
  (a) a 2N bits signal input terminal where N is an integer;
  (b) a first memory having 2N bits cells connected to said signal input terminal; said first memory having upper and lower inputs and upper and lower outputs;
  (c) a second memory having 2N bits cells connected to the upper and lower outputs of the corresponding cells of said first memory, respectively;
  (d) a third memory having 2N bits cells, said third memory having upper and lower input bit terminals which are connected to the lower outputs and the lower inputs of said first memory, respectively; and
  (e) A first switch connected to the output of said second memory and to the output of said third memory for introducing expanded-bit output signals from one of N bits of said input terminal when said third memory is selected.

2. A bit number expansion system according to claim 1, wherein said first, second and third memories are formed of 2N D- type flip-flops, respectively.

3. A bit number expansion system according to claim 1, wherein said first switch is controlled such that the output signals of said second memory are selected when the bit number of said input signal is 2N and the output signals of said third memory are selected when the bit number of said input signal is N.

4. A bit number reduction system comprising:
  (A) a first memory having a first set of N number of output terminals and a second set of N number of output terminals;
  (B) signal input means connected to said first memory;
  (C) a second memory having N bits cells, said second memory being supplied with output signals from said first set of N number of output terminals of said first memory;
  (D) a first switch for selecting the outputs of said second memory or the outputs of said second set of N number of output terminals of said first memory; and
  (E) a third memory having a first set of N number of inputs connected to said first set of N number of output terminals of said first memory and a second set of N number of inputs connected to the output terminal of said first switch, said third memory having a set of N number of output terminals for bit number reduction.

5. A bit number reduction system according to claim 4, wherein said first and third memories include 2N D type flip-flops, and said second memory includes N D flip-flops.

6. A bit number conversion system comprising:
(1) a 2N bits signal input terminal;
(2) a first memory having 2N bits cells and having upper and lower inputs and upper and lower outputs, said upper and lower inputs being connected to said signal input terminal;
(3) a second memory having 2N bits cells connected to the upper and lower outputs of the corresponding cells of said first memory, respectively;
(4) a third memory having 2N bits cells and upper and lower inputs, said upper and lower input bit terminals thereof being connected to the lower outputs and the lower inputs of said first memory, respectively;
(5) A first switch connected to the output of said second memory and to the output of said third memory for introducing an expanded-bit output signals from one of N bits of said input terminal when said third memory is selected;
(6) a fourth memory having a first set of N number of output terminals and a second set of N number of output terminals;
(7) a 2N bits signal input terminal connected to said fourth memory;
(8) a fifth memory having N bits cells, said fifth memory being supplied with output signals from said first set of N number of output terminals of said fourth memory;
(9) a second switch for selecting the outputs of said fifth memory or the outputs of said second set of N number of output terminals of said fourth memory;
(10) a sixth memory having a first set of N number of inputs connected to said first set of N number of output terminals of said fourth memory and a second set of N number of inputs connected to the output terminal of said second switch, said sixth memory having a set of N number of output terminals for bit number reduction; and
(11) a digital processing block having an input terminal adapted to be connected to the output of said first switch and having an output terminal adapted to be connected to said 2N bits signal input terminal of said fourth memory.

7. A bit number conversion system according to claim 6, wherein said first, second, third, fourth, fifth and sixth memories are formed of D type flip-flop memories, respectively.

8. A bit number conversion system according to claim 6, wherein said 2N bit input signal is a chroma signal of a color television receiver.

* * * * *